(12) United States Patent
Ikeuchi et al.

(10) Patent No.: US 11,195,984 B2
(45) Date of Patent: Dec. 7, 2021

(54) PIEZOELECTRIC TRANSFORMER

(71) Applicant: Murata Manufacturing Co., Ltd., Nagaokakyo (JP)

(72) Inventors: Shinsuke Ikeuchi, Nagaokakyo (JP); Yoichi Mochida, Nagaokakyo (JP); Kansho Yamamoto, Nagaokakyo (JP); Takuo Hada, Nagaokakyo (JP); Hideya Horiuchi, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 570 days.

(21) Appl. No.: 16/243,171

(22) Filed: Jan. 9, 2019

(65) Prior Publication Data
US 2019/0148619 A1 May 16, 2019

Related U.S. Application Data

(63) Continuation of application No. PCT/JP2017/025076, filed on Jul. 10, 2017.

(30) Foreign Application Priority Data

Jul. 14, 2016 (JP) .............................. JP2016-139788

(51) Int. Cl.
*H01L 41/107* (2006.01)
*H01L 41/187* (2006.01)
(Continued)

(52) U.S. Cl.
CPC ........ *H01L 41/107* (2013.01); *H01L 41/0472* (2013.01); *H01L 41/053* (2013.01);
(Continued)

(58) Field of Classification Search
CPC . H01L 41/107; H01L 41/0472; H01L 41/053; H01L 41/187; H01L 41/1876
See application file for complete search history.

(56) References Cited

U.S. PATENT DOCUMENTS 4,985,926 A 1/1991 Foster
5,371,430 A * 12/1994 Sato ...................... H01L 41/107
310/359
(Continued)

FOREIGN PATENT DOCUMENTS

JP H027584 A 1/1990
JP 3060666 B2 7/2000
(Continued)

OTHER PUBLICATIONS

International Search Report issued for PCT/JP2017/025076, dated Sep. 12, 2017.
(Continued)

*Primary Examiner* — J. San Martin
(74) *Attorney, Agent, or Firm* — Arent Fox LLP

(57) ABSTRACT

A piezoelectric transformer that includes a base and an upper layer supported by the base. The upper layer includes a first piezoelectric layer that includes the portion of the upper layer that is interposed between an output electrode and an intermediate electrode, and a second piezoelectric layer that is superposed with the first piezoelectric layer and includes the portion of the upper layer interposed between the intermediate electrode and an input electrode in at least n vibration portions. Moreover, the input electrode includes multiple input electrode pieces and the output electrode includes multiple output electrode pieces. In addition, wiring lines are routed such that voltages of opposite phases can be respectively applied to a first input electrode piece group and a second input electrode piece group with the potential of the intermediate electrode serving as a reference.

20 Claims, 11 Drawing Sheets

(51) Int. Cl.
   *H01L 41/047*   (2006.01)
   *H01L 41/053*   (2006.01)
   *H01L 41/293*   (2013.01)
   *H01L 41/314*   (2013.01)
   *H01L 41/318*   (2013.01)
   *H01L 41/332*   (2013.01)

(52) U.S. Cl.
   CPC ........ *H01L 41/187* (2013.01); *H01L 41/1876* (2013.01); *H01L 41/293* (2013.01); *H01L 41/314* (2013.01); *H01L 41/318* (2013.01); *H01L 41/332* (2013.01)

(56) References Cited

U.S. PATENT DOCUMENTS

| | | | |
|---|---|---|---|
| 6,037,706 A * | 3/2000 | Inoi | H01L 41/107 310/359 |
| 8,978,469 B2 | 3/2015 | Takaoka et al. | |
| 2002/0030420 A1 | 3/2002 | Tsukai et al. | |
| 2006/0202769 A1 * | 9/2006 | Nagao | H03H 9/174 331/73 |
| 2007/0138919 A1 | 6/2007 | Ohki et al. | |
| 2009/0195330 A1 | 8/2009 | Nakamura et al. | |
| 2012/0176002 A1 | 7/2012 | Kim et al. | |
| 2012/0247207 A1 | 10/2012 | Takoaka et al. | |
| 2015/0266058 A1 | 9/2015 | Yoshida et al. | |
| 2015/0280104 A1 | 10/2015 | Asano | |
| 2016/0329877 A1 | 11/2016 | Nishimura et al. | |
| 2017/0069822 A1 | 3/2017 | Nishimura | |
| 2018/0069168 A1 * | 3/2018 | Ikeuchi | H01L 41/09 |
| 2019/0172996 A1 * | 6/2019 | Ikeuchi | H01L 41/083 |

FOREIGN PATENT DOCUMENTS

| | | |
|---|---|---|
| JP | 2000312129 A | 11/2000 |
| JP | 2002152006 A | 5/2002 |
| JP | 2002223145 A | 8/2002 |
| JP | 2007173297 A | 7/2007 |
| JP | 2009020086 A | 1/2009 |
| JP | 2009225503 A | 10/2009 |
| JP | 2010156704 A | 7/2010 |
| JP | 2012147418 A | 8/2012 |
| JP | 2012215518 A | 11/2012 |
| JP | 2015185915 A | 10/2015 |
| WO | 2007145290 A1 | 12/2007 |
| WO | 2014097681 A1 | 6/2014 |
| WO | 2015111503 A1 | 7/2015 |
| WO | 2015171224 A1 | 11/2015 |
| WO | 2016006433 A1 | 1/2016 |

OTHER PUBLICATIONS

Written Opinion of the International Searching Authority isssued for PCT/JP2017/025076, dated Sep. 12, 2017.

* cited by examiner

PIEZOELECTRIC TRANSFORMER

CROSS REFERENCE TO RELATED APPLICATIONS

The present application is a continuation of PCT/JP2017/025076 filed Jul. 10, 2017, which claims priority to Japanese Patent Application No. 2016-139788, filed Jul. 14, 2016, the entire contents of each of which are incorporated herein by reference.

TECHNICAL FIELD

The present invention relates to a piezoelectric transformer.

BACKGROUND

International Publication No. WO 2015/171224 (referred to as "Patent Document 1") discloses an ultrasonic transducer that includes piezoelectric layers. In Patent Document 1, a vibration film is formed by stacking a multilayer structure consisting of two different piezoelectric layers on a substrate.

In this ultrasonic transducer, a vibration mode is utilized that accompanies displacement in a direction perpendicular to a surface of the vibration film such that there is an anti-node at a center portion of the vibration film and a node at an outer peripheral portion of the vibration film.

International Publication No. WO 2016/006433 (referred to as "Patent Document 2") discloses a vibration device. The vibration device includes a plurality of vibration portions that connected in parallel with each other.

Adjacent vibration portions vibrate with opposite phases.
Patent Document 1: International Publication No. WO 2015/171224.
Patent Document 2: International Publication No. WO 2016/006433.

The device disclosed in Patent Document 1 is an ultrasonic transducer, and if a piezoelectric transformer were to be implemented by using the multilayer structure consisting of the piezoelectric layers included in the ultrasonic transducer, a voltage would be applied to a second piezoelectric layer, the vibration film formed by the multilayer structure would be excited in a specific vibration mode, and a transformed voltage would be extracted from a first piezoelectric layer. However, there is a problem with this piezoelectric transformer in that the impedance per element is high and it is difficult to achieve matching with an external circuit. Increasing the surface area of the vibration film may be considered as a way of reducing the impedance, but there is an additional problem in that the resonant frequency is undesirably changed when the surface area of the vibration film is made larger.

The same problem also exists for piezoelectric vibrators. In order to solve this problem, in the vibration device disclosed in Patent Document 2, a single piezoelectric vibrator is formed by connecting a plurality of vibration portions in parallel with each other such that adjacent vibration portions are driven with opposite phases. By forming the vibration device using a plurality of vibration portions in this way, the impedance can be reduced without greatly changing the resonant frequency compared with the case of a single vibration portion of the same shape. However, when a piezoelectric transformer is to be implemented, not only is a voltage provided to induce a vibration, but a voltage obtained from the vibration additionally needs to be extracted, and therefore a piezoelectric transformer cannot be implemented using the vibration device disclosed in Patent Document 2.

SUMMARY OF THE INVENTION

Accordingly, it is an object of the present invention to provide a piezoelectric transformer while lowering impedance.

Thus, according to an exemplary embodiment, a piezoelectric transformer is disclosed that includes a base and an upper layer that is supported by the base. The upper layer includes a vibration portion assembly portion that is constituted by a part of the upper layer that is not superposed with the base. The vibration portion assembly portion includes an output electrode, an intermediate electrode, and an input electrode, which are arranged so as to be separated from each other in a thickness direction and so as to be sequentially arrayed in the thickness direction. Moreover, the vibration portion assembly portion includes n vibration portions arrayed in one direction, where n is an integer greater than or equal to 2. The upper layer includes a first piezoelectric layer that is arranged so as to include a part of the upper layer that is interposed between the output electrode and the intermediate electrode in at least the n vibration portions and a second piezoelectric layer that is arranged so as to be superposed with the first piezoelectric layer and is arranged so as to include a part of the upper layer that is interposed between the intermediate electrode and the input electrode in at least the n vibration portions. The input electrode includes one or more and n or less input electrode pieces that are arrayed in a divided manner so as to respectively correspond to at least some of the n vibration portions. The output electrode includes one or more and n or less output electrode pieces that are arrayed in a divided manner so as to respectively correspond to at least some of the n vibration portions. The first piezoelectric layer and the second piezoelectric layer are polarized in a fixed direction throughout the n vibration portions. Referring to the n vibration portions as first to nth vibration portions from one side to another side along the one direction, wiring lines are routed such that, among the one or more and n or less input electrode pieces, voltages of opposite phases, with a potential of the intermediate electrode serving as a reference, can be respectively applied to a first input electrode piece group, which is a group to which one or more of the input electrode pieces corresponding to the odd-numbered vibration portions belong, and a second input electrode piece group, which is a group to which one or more of the input electrode pieces corresponding to the even-numbered vibration portions belong. In addition, wiring lines are also arranged such that, among the one or more and n or less output electrode pieces, a phase of a voltage of a first output electrode piece group, which is a group to which one or more of the output electrode pieces corresponding to the odd-numbered vibration portions belong, or a phase of a voltage of a second output electrode piece group, which is a group to which one or more of the output electrode pieces corresponding to the even-numbered vibration portions belong, is inverted, the two voltages are then combined, and a voltage can be extracting using a potential of the intermediate electrode as a reference.

According to the exemplary embodiment of the present disclosure, a piezoelectric transformer while impedance is reduced.

DETAILED DESCRIPTION OF EMBODIMENTS

Figure 1:
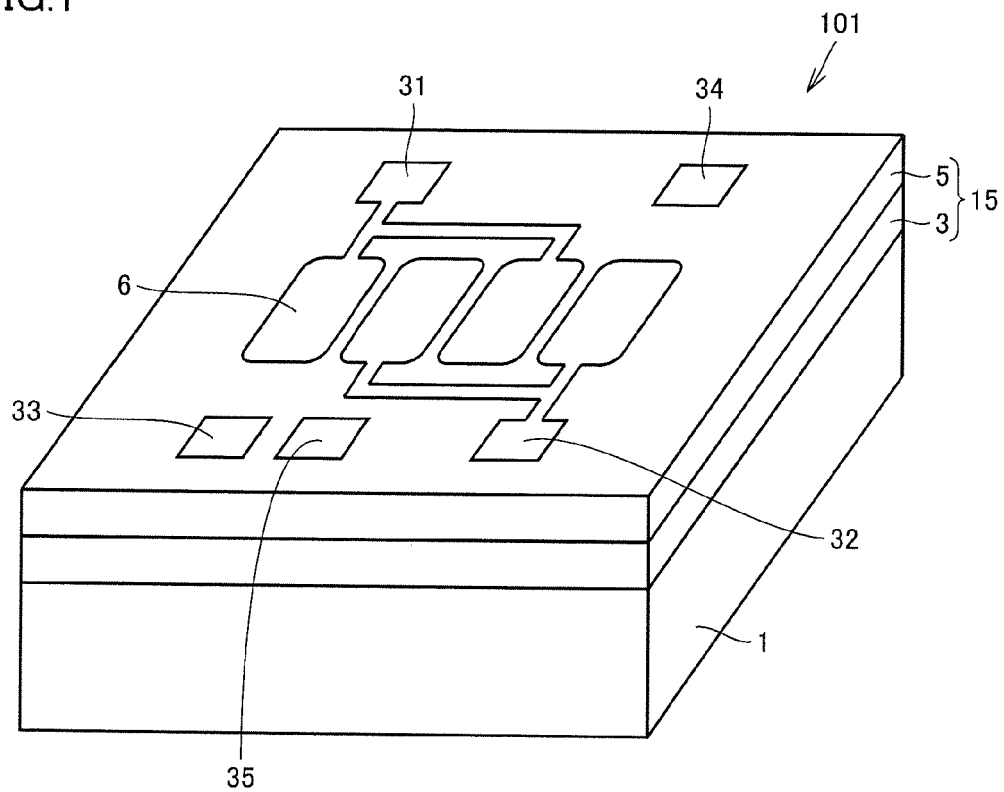
FIG. 1 is a perspective view of a piezoelectric transformer of a first exemplary embodiment.

It should be appreciated that the dimensional ratios depicted in the drawings do not necessarily accurately depict the actual dimensional ratios, and the dimensional ratios in the drawings may be depicted in an exaggerated manner for convenience of explanation. In the following description, when reference is made to the concepts of above and below, the meanings of these terms are not limited to meaning absolutely above and below, and may mean relatively above and below within the illustrated states.

Embodiment 1

Figure 2:
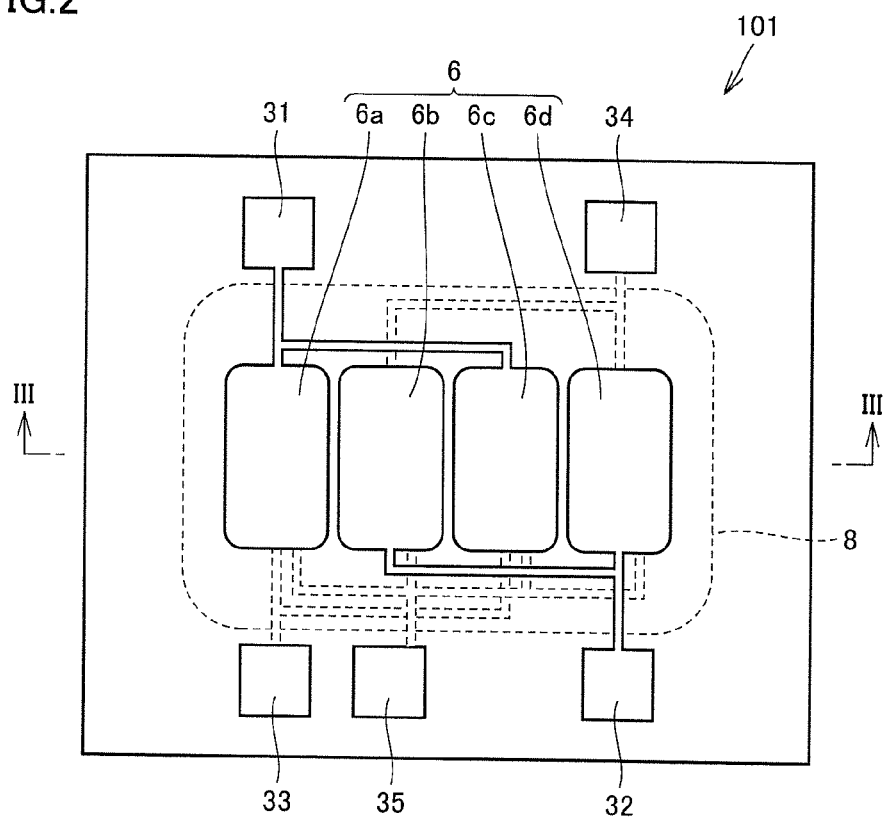
FIG. 2 is a plan view of the piezoelectric transformer of the first exemplary embodiment.
Figure 3:
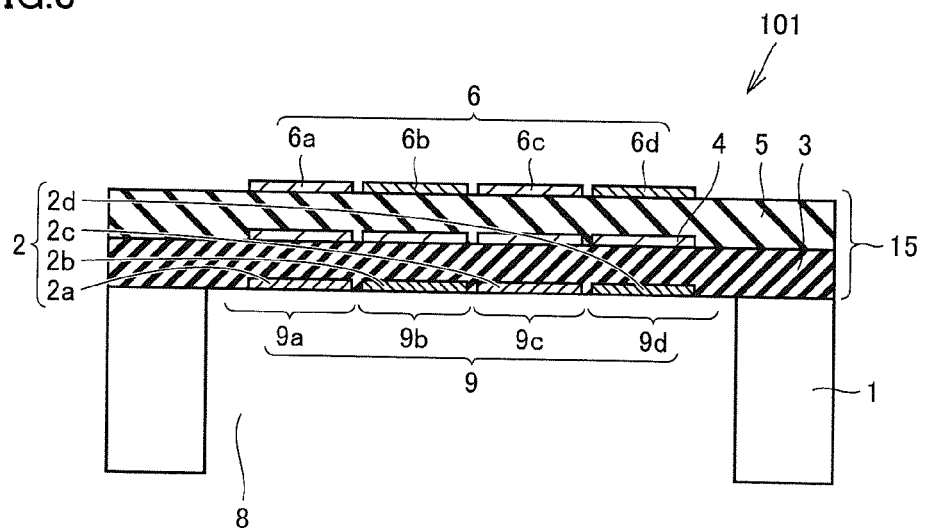
FIG. 3 is a sectional view looking in the direction of arrows and taken along line III-III in FIG. 2.
Figure 4:
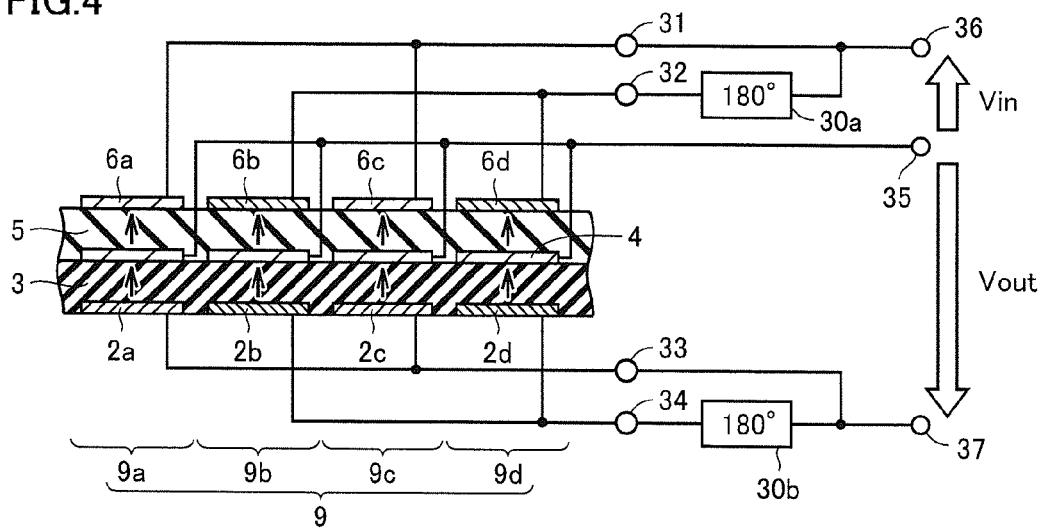
FIG. 4 is a conceptual diagram of the piezoelectric transformer of the first exemplary embodiment.

A piezoelectric transformer according to a first exemplary embodiment will be described while referring to FIGS. 1 to 4. FIG. 1 illustrates the exterior of a piezoelectric transformer 101 of this embodiment. FIG. 2 illustrates a plan view of the piezoelectric transformer 101. FIG. 3 illustrates a sectional view looking in the direction of the arrows and taken along line III-III in FIG. 2. FIG. 4 illustrates a conceptual diagram in which a vibration film of the piezoelectric transformer 101 is illustrated together with related wiring lines.

As illustrated in FIG. 1, the piezoelectric transformer 101 includes a base 1 and an upper layer 15 that is supported by the base 1. The base 1 may be a member composed of Si, for example. It is noted however that the base 1 is not limited to being a plate-shaped member, and can be formed using a plate-shaped member. For example, the base 1 may be formed using a Si substrate.

As illustrated in FIG. 3, the upper layer 15 includes a vibration portion assembly portion 9 that is formed from the portion of the upper layer 15 that is not superposed with the base 1 (i.e., in the plan view of the piezoelectric transformer 101). The vibration portion assembly portion 9 includes an output electrode 2, an intermediate electrode 4, and an input electrode 6, which are arranged so as to be separated from each other in a thickness direction and so as to be sequentially arrayed in the thickness direction. The vibration portion assembly portion 9 includes n vibration portions 9a to 9d arrayed in one direction (e.g., in the width direction that is perpendicular to the thickness direction of the piezoelectric transformer 101), where n is an integer greater than or equal to 2. Here, for convenience of explanation, it will be assumed that n=4 in the following description, but this is merely an example and n may be an integer other than 4. The upper layer 15 includes: a first piezoelectric layer 3 that is arranged (i.e., disposed) so as to include the part of the upper layer 15 that is interposed between the output electrode 2 and the intermediate electrode 4 in at least the n vibration portions 9a to 9d. Moreover, the upper layer 15 also includes a second piezoelectric layer 5 that is arranged so as to be superposed with the first piezoelectric layer 3 and is arranged so as to include the part of the upper layer 15 that is interposed between the intermediate electrode 4 and the input electrode 6 in at least the n vibration portions 9a to 9d. In addition, the input electrode 6 includes one or more and n or less input electrode pieces 6a to 6d that are arrayed in a divided manner so as to respectively correspond to at least some of the n vibration portions 9a to 9d. The output electrode 2 includes one or more and n or less output electrode pieces 2a to 2d that are arrayed in a divided manner so as to respectively correspond to at least some of the n vibration portions 9a to 9d. The intermediate electrode 4 includes one or more and n or less intermediate electrode pieces that are arrayed in a divided manner so as to respectively correspond to at least some of the n vibration portions 9a to 9d.

Here, a case is described in which the number n of vibration portions is four and the number of each of the input electrode pieces, the output electrode pieces and the intermediate electrode pieces is n (i.e., four), but it is reiterated than n equaling four is merely an example of the exemplary embodiment. Thus, it is noted that the number of any of the input electrode pieces, output electrode pieces and intermediate electrode pieces may be less than the number n of vibration portions.

According to the exemplary aspect, the first piezoelectric layer 3 is polarized in a fixed direction throughout the n vibration portions 9a to 9d. The second piezoelectric layer 5 is also polarized in a fixed direction throughout the n vibration portions 9a to 9d. The arrows illustrated inside the first piezoelectric layer 3 and the second piezoelectric layer 5 in FIG. 4 indicate the direction of polarization. Hereafter, for convenience of explanation, the n vibration portions will be referred to as first to nth vibration portions from one side to the other side in the one direction. Wiring lines are routed such that, among the one or more and n or less input electrode pieces 6a to 6d, voltages of opposite phases, with the potential of the intermediate electrode 4 serving as a reference, can be respectively applied to a first input electrode piece group, which is a group to which one or more of the input electrode pieces corresponding to the odd-numbered vibration portions belong, and a second input electrode piece group, which is a group to which one or more of the input electrode pieces corresponding to the even-numbered vibration portions belong. Wiring lines are routed such that, among the one or more and n or less output electrode pieces 2a to 2d, the phase of a voltage of a first output electrode piece group, which is a group to which one or more out of the output electrode pieces 2a and 2c corresponding to the odd-numbered vibration portions 9a and 9c belong, or the phase of a voltage of a second output electrode piece group, which is a group to which one or more out of the output electrode pieces 2b and 2d corresponding to the even-numbered vibration portions 9b and 9d belong, is inverted, the two voltages are then combined, and a voltage can be extracting using the potential of the intermediate electrode 4 as a reference. In the example illustrated here, the first output electrode piece group is a group that includes all the output electrode pieces 2a and 2c and the second output electrode piece group is a group that includes all the output electrode pieces 2b and 2d. in the exemplary aspect, the piezoelectric transformer 101 is used by inputting voltages of opposite phases to pad electrodes 31 and 32 while using a potential supplied to a pad electrode 35 as a reference. The piezoelectric transformer itself may be provided with a mechanism that is for making the voltages input to the pad electrodes 31 and 32 (e.g., FIG. 2) have opposite phases from each other. Alternatively, the mechanism for making the input voltages have opposite phases from each other may not be included in the piezoelectric transformer 101 and may instead be prepared separately by the user. The same applies do the output side. In other words, the piezoelectric transformer itself may be provided with a mechanism for inverting the phase of either of the voltages of the first output electrode piece group and the second output electrode piece group and then combining the resulting voltages. Alternatively, the mechanism may not be included in the piezoelectric transformer 101 and the mechanism may be prepared separately by the user.

Next, a manufacturing method for obtaining the piezoelectric transformer 101 will be described. First, a Mo film is deposited on the surface of a Si substrate, which serves as base 1, so as to have a thickness of around 100 nm, and the Mo film is subjected to patterning. As a result, the output electrode 2 is formed. Before forming the output electrode 2, an output electrode protective film (not illustrated) can be formed by depositing an AlN film or the like. The output electrode protective film is a protective film formed so as to cover the output electrode 2 in FIG. 3 in one piece from below. An example is illustrated in FIG. 3 in which there is no output electrode protective film.

An AlN film is deposited as the first piezoelectric layer 3 so as to cover the output electrode 2 from above using a sputtering method such that the AlN film has a thickness of 1100 nm. Next, a Pt film is deposited with a thickness of around 100 nm so as to cover the first piezoelectric layer 3, and the Pt film is then subjecting to patterning. An adhesive layer may be formed in advance between the Pt film and the AlN film constituting the first piezoelectric layer 3. The intermediate electrode 4 is formed of the patterned Pt film.

Next, a PZT film is deposited as the second piezoelectric layer 5 using a sputtering method or a sol gel method so as to have a thickness of 1200 nm. After that, an Au film with a thickness of around 100 nm is deposited so as to cover the second piezoelectric layer 5 and the Au film is then subjected to patterning. An adhesive layer may be formed in advance between the Au film and the PZT film serving as the second piezoelectric layer 5. The input electrode 6 is formed of the patterned Au film.

Next, etching is performed on the first piezoelectric layer 3 and the second piezoelectric layer 5 in order to expose parts where pad electrodes will be formed that are to be respectively connected to the output electrode 2 and the intermediate electrode 4. The pad electrode 35 is connected to the intermediate electrode 4 by wiring lines. In this embodiment, the intermediate electrode 4 is divided into one or more and n or less intermediate electrode pieces, and therefore, as illustrated in FIG. 2, wiring lines are individually connected from the pad electrode 35 to the one or more and n or less intermediate electrode pieces. The pad electrode 35 is at the same height as the intermediate electrode 4, and the pad electrode 35 is exposed by etching through the second piezoelectric layer 5. The pad electrode 33 is connected to the output electrode pieces 2a and 2c, which constitute the first output electrode piece group, by wiring lines. The pad electrode 34 is connected to the output electrode pieces 2b and 2d, which constitute the second output electrode piece group, by wiring lines. The pad electrodes 33 and 34 are at the same height as the output electrode 2, and the pad electrodes 33 and 34 are exposed by etching through the first piezoelectric layer 3 and the second piezoelectric layer 5. After that, Al films or the like are formed so as to cover the exposed pad electrodes at the parts where the pad electrodes are exposed.

Next, the base 1 is etched from the rear surface of the base 1 until the output electrode 2 and the first piezoelectric layer 3 are reached. At this time, if the above-mentioned output electrode protective film is present, progress of the etching can be easily stopped by the output electrode protective film. In this way, an opening 8 is formed in the base 1 and the remaining part above the opening 8 forms the vibration portion assembly portion 9. In the example described here, the opening 8 is formed as a through hole.

The piezoelectric transformer 101 having the structure illustrated in FIGS. 1 to 3 can be obtained as described above.

In the example described in this embodiment, the vibration portion assembly portion 9 is mainly formed of a multilayer structure consisting of the output electrode 2, the first piezoelectric layer 3, the intermediate electrode 4, the second piezoelectric layer 5, and the input electrode 6, but in addition to these constituent components, a AlN film, a SiN film, a $SiO_2$ film, a $ZrO_2$ film or the like separately formed with a thickness of around 1000 nm may be stacked as a flexible film. In addition, a Si layer serving as an active layer may be used as a flexible film by using a SOI substrate or the like instead of a Si substrate in order to obtain the base 1. The thickness of the Si layer serving as an active layer in the SOI substrate may be 3-50 μm, for example, and the Si layer may be used as a flexible film without altering the thickness of the Si layer.

In the example described in this embodiment, the output electrode 2, the intermediate electrode 4, and the input electrode 6, which are located in the vibration portion assembly portion 9, are each divided into four island-shaped parts. Among these electrodes, only the input electrode 6 can be seen in FIG. 2, and the intermediate electrode 4 is arranged in such a manner as to be hidden behind the input electrode 6 with respect to the plane of the figure. The output electrode 2 is arranged behind the intermediate electrode 4 further toward the rear with respect to the plane of the figure. Here, a case has been described in which it is assumed that the number n of vibration portions is 4, and therefore the number of pieces that each of the output electrode 2, the intermediate electrode 4, and the input electrode 6 is divided into is "4", but it should be appreciated that this is merely an exemplary aspect and if the number n of vibration portions is changed, the number of pieces into which each of the output electrode 2, the intermediate electrode 4, and the input electrode 6 is divided into can be changed to match this number. The number of divided pieces of the output electrode 2, the intermediate electrode 4, and the input electrode 6 may be another number, as appropriate.

Furthermore, as illustrated in FIGS. 2 and 4, adjacent electrode pieces of the output electrode 2 and the input electrode 6 are electrically isolated from each other and an electrode piece and an electrode piece subsequent to the adjacent electrode piece are connected so as to be electrically conductive with each other via a wiring line. As a result, the one or more and n or less output electrode pieces 2a to 2d of the output electrode 2 are divided into two groups. In other words, the output electrode pieces 2a to 2d are divided into the first output electrode piece group consisting of the output electrode pieces 2a and 2c and the second output electrode piece group consisting of the output electrode pieces 2b and 2d. The output electrode pieces inside the same output electrode piece group are at the same electrical potential and different output electrode piece groups may be at different potentials.

The one or more and n or less input electrode pieces 6a to 6d of the input electrode 6 can also be similarly divided into two groups. In other words, the input electrode pieces 6a to 6d are divided into the first input electrode piece group consisting of the input electrode pieces 6a and 6c and the second input electrode piece group consisting of the input electrode pieces 6b and 6d. The input electrode pieces inside the same input electrode piece group are at the same electrical potential and different input electrode piece groups may be at different potentials.

The intermediate electrode 4 is divided into four island-shaped intermediate electrode pieces, but the island-shaped intermediate electrode pieces are electrically connected to each other via wiring lines and form a single intermediate electrode piece group.

The wiring lines are illustrated as solid lines and broken lines in FIG. 2 and are illustrated such that the positions of wiring lines located in different layers are slightly shifted from each other in order to make it easier to understand where the wiring lines extending from different pad electrodes are connected to. The shifted positions of the wiring lines are merely for ease of explanation, and in reality, wiring lines located in different layers may have a positional relationship in which the wiring lines are superposed with one another when viewed from above. The electrical connection relationships of the wiring lines are also illustrated in FIG. 4.

In this embodiment, as illustrated in FIG. 4, the first input electrode piece group is connected to an input terminal 36 of an alternating-current power supply and the second input electrode piece group is connected to the input terminal 36 via a phase inverter 30a, with the potential of the intermediate electrode 4 serving as a reference potential. Here, the input terminal 36 is provided separately from the pad electrodes 31 and 32, but the phase inverter 30a may be included in the piezoelectric transformer 101. In this case, a phase-inverting function may be provided between the pad electrode 31 and the first input electrode piece group or between the pad electrode 32 and the second input electrode piece group. If a phase-inverting function is provided at either these locations, a configuration can be adopted in which input voltages Vin of the same phase supplied from an alternating-current power supply are simply connected to both the pad electrodes 31 and 32 and the phase of one of these input voltages Vin is inverted.

In this embodiment, an output voltage Vout is extracted at an output terminal 37 with the electrical potential of the intermediate electrode 4 serving as a reference potential. In order to extract the output voltage Vout, the pad electrode 33, which is connected to the first output electrode piece group, is connected to the output terminal 37, and the pad electrode 34, which is connected to the second output electrode piece group, is connected to the output terminal 37 via a phase inverter 30b. Here, the output terminal 37 is provided separately from the pad electrodes 33 and 34, but the phase inverter 30b may be included in the piezoelectric transformer 101. In such a case, a phase-inverting function may be provided between the pad electrode 33 and the first output electrode piece group or between the pad electrode 34 and the second output electrode piece group, and as a result output voltages Vout of the same phase can be extracted from the pad electrodes 33 and 34.

The device obtained as described above can be used as a piezoelectric transformer that transforms the voltage of an alternating-current power supply and outputs the transformed voltage to an output terminal. According to this embodiment, a piezoelectric transformer can be realized while reducing impedance. This will be described in detail below.

Specifically, the piezoelectric transformer of this embodiment is driven using the principles described below. First, the PZT film constituting the second piezoelectric layer 5 expands and contracts in response to a voltage applied from the alternating-current power supply, and as a result, the vibration portions 9a to 9d are driven as illustrated in FIG. 5.

Figure 5:
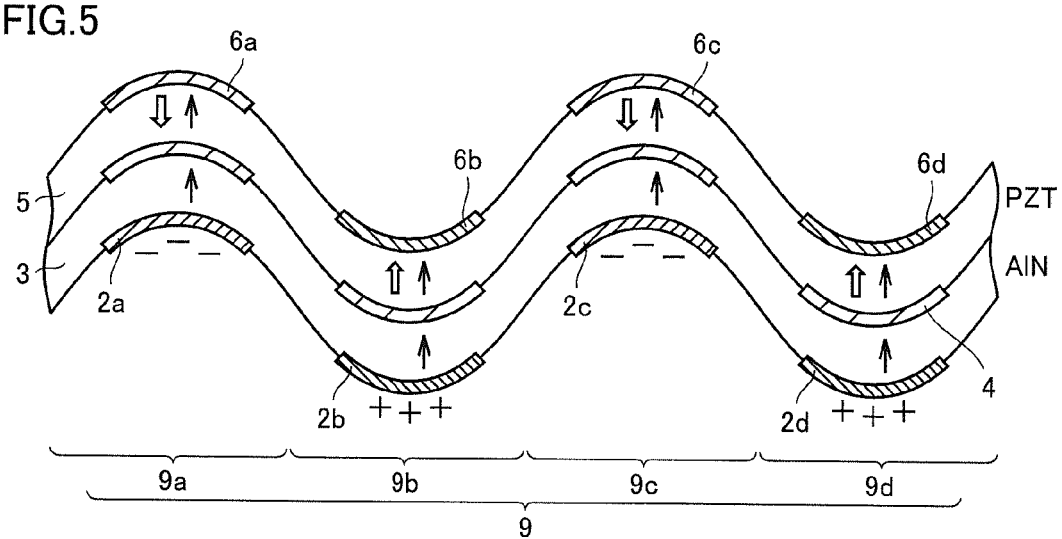
FIG. 5 is an explanatory diagram for the behavior of a vibration portion assembly portion of the piezoelectric transformer of the first exemplary embodiment.
Figure 6:
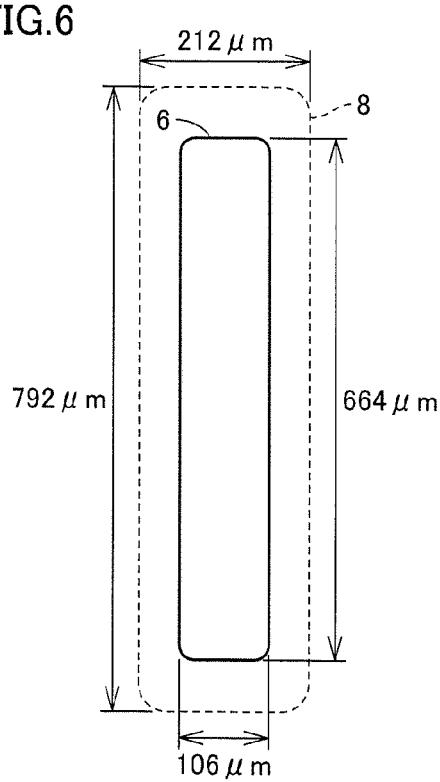
FIG. 6 is a first explanatory diagram for an experiment performed in relation to the first exemplary embodiment.
Figure 7:
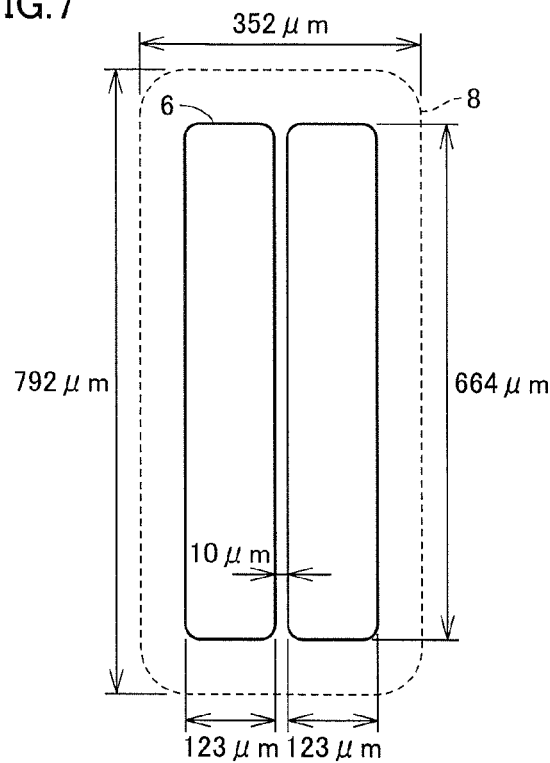
FIG. 7 is a second explanatory diagram for an experiment performed in relation to the first exemplary embodiment.
Figure 8:
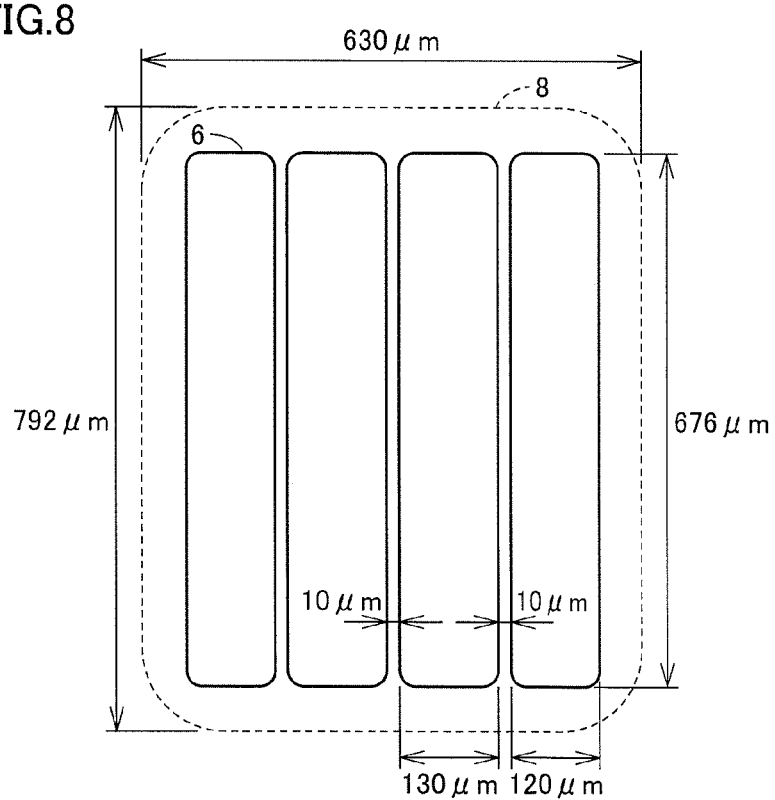
FIG. 8 is a third explanatory diagram for an experiment performed in relation to the first exemplary embodiment.
Figure 9:
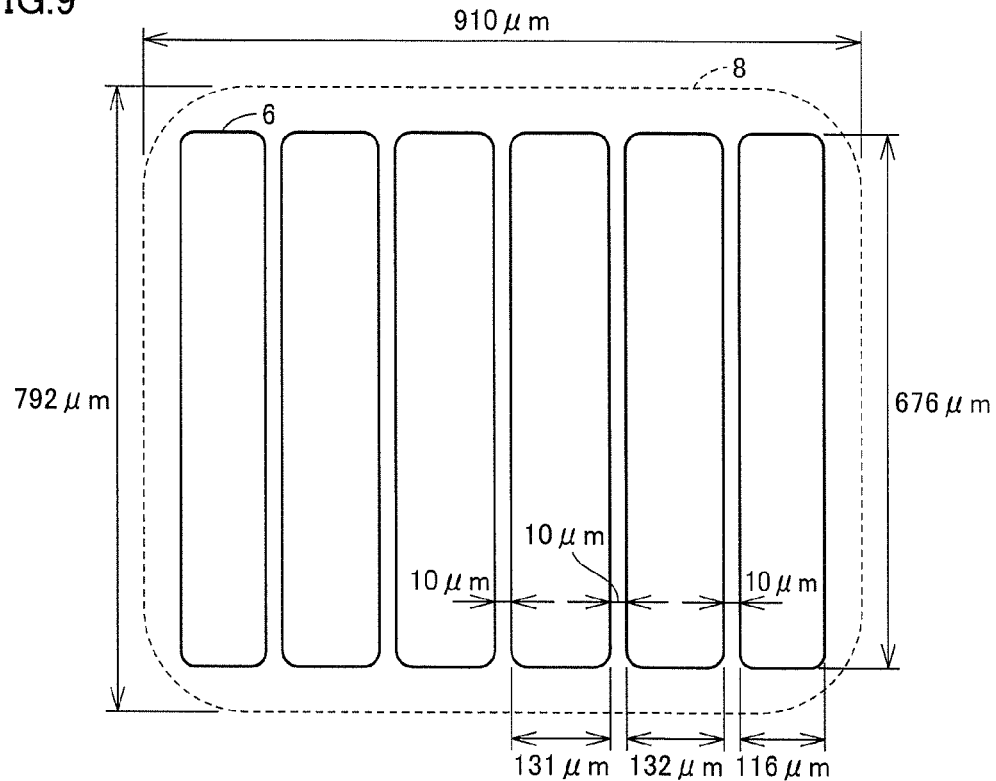
FIG. 9 is a fourth explanatory diagram for an experiment performed in relation to the first exemplary embodiment.

In FIG. 5, the simple arrows illustrated inside the first piezoelectric layer 3 and the second piezoelectric layer 5 indicate the direction of polarization, and the outline arrows illustrated inside the second piezoelectric layer 5 indicate the directions of a generated electric field.

At this time, as illustrated in FIG. 5, the supplied voltages have opposite phases from each other in the regions in which the input electrode pieces 6a and 6c constituting the first input electrode piece group are arranged and in the regions in which the input electrode pieces 6b and 6d constituting the second input electrode piece group are arranged, and therefore the deformations generated in the second piezoelectric layer 5 in these regions have opposite phases from each other. The regions in which the first input electrode piece group is arranged and the regions in which the second input electrode piece group is arranged are arrayed in an alternating manner, and therefore a vibration mode is excited in which the displacement in the regions in which the first input electrode piece group is arranged and the displacement in the regions in which the second input electrode piece group is arranged have opposite phases. Thus, the vibration portions 9a to 9d undergo resonant vibration.

A similar relationship also exists between the regions in which the output electrode pieces 2a and 2c constituting the first output electrode piece group are arranged and the regions in which the output electrode pieces 2b and 2d constituting the second output electrode piece group are arranged. Charge is generated in the AlN film constituting the first piezoelectric layer 3 due to the resonant driving of the vibration portions 9a to 9d. Since the displacements induced by the second piezoelectric layer 5 have opposite phases from each other, as indicated by "+" (i.e., a plus symbol) and "−" (i.e., a minus symbol) in FIG. 5, the polarities of the charges generated in the regions in which the first output electrode piece group is arranged and in the regions in which the second output electrode piece group is arranged are opposite to each other. Finally, these charges are detected as an output voltage from the output terminal 37. The output voltage Vout obtained at this time can be made to have a different value from the input voltage Vin. In particular, when the first piezoelectric layer 3 is formed of a AlN film and the second piezoelectric layer 5 is formed of a PZT film as in the example described here, the output voltage Vout can be made larger than the input voltage Vin, and therefore a voltage boosting operation is realized. In addition, by swapping the input and output with each other in this configuration, a voltage lowering operation can also be realized.

When manufacturing a piezoelectric transformer, it is preferable to perform a poling treatment by applying a direct-current voltage that is larger than the input voltage Vin between the input electrode pieces 6a and 6c constituting the first input electrode piece group and the intermediate electrode 4 prior to driving the device as a piezoelectric transformer. Similarly, in this case, it is also preferable to perform a poling treatment by applying a direct-current voltage having the same amplitude and polarity as the previously applied direct-current voltage between the input electrode pieces 6b and 6d constituting the second input electrode piece group and the intermediate electrode 4.

Experimental Results

In the above description, it is assumed that the number of each of the output electrode pieces, the intermediate electrode pieces, and the input electrode pieces in one vibration portion assembly portion 9 is n, and n=4 in the piezoelectric transformer 101 illustrated in FIGS. 1 to 5. With respect to this, piezoelectric transformers in which n=1, 2, 4, and 6 were manufactured. The size of the vibration film in each piezoelectric transformer is determined by the size of the opening 8. The sizes of the opening 8 and the sizes of the electrode pieces in the respective piezoelectric transformers are illustrated in FIGS. 6 to 9. In each case, the sizes of the output electrode pieces, the intermediate electrode pieces, and the input electrode pieces, which have a positional relationship of being superposed with each other in a front-back direction with respect to the plane of the figure, were assumed to be the same as each other. In addition, all the electrodes were arranged so as to be symmetrical with respect to the center of the vibration film. As a result, a vibration mode can be excited in which bending vibration occurs at substantially the same resonant frequency for all values of n.

Figure 10:
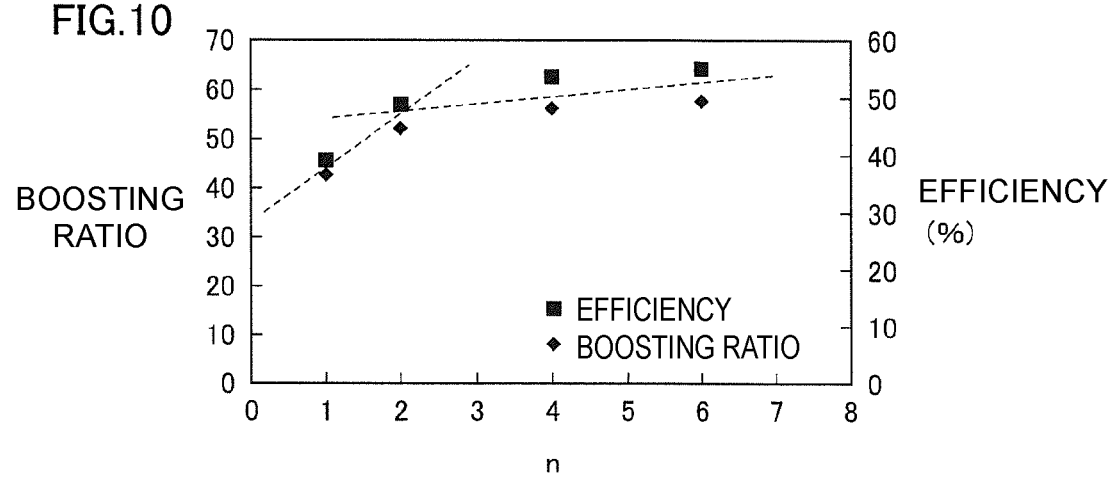
FIG. 10 is a graph relating to a boosting ratio obtained in the experiment performed in relation to the first exemplary embodiment.
Figure 11:
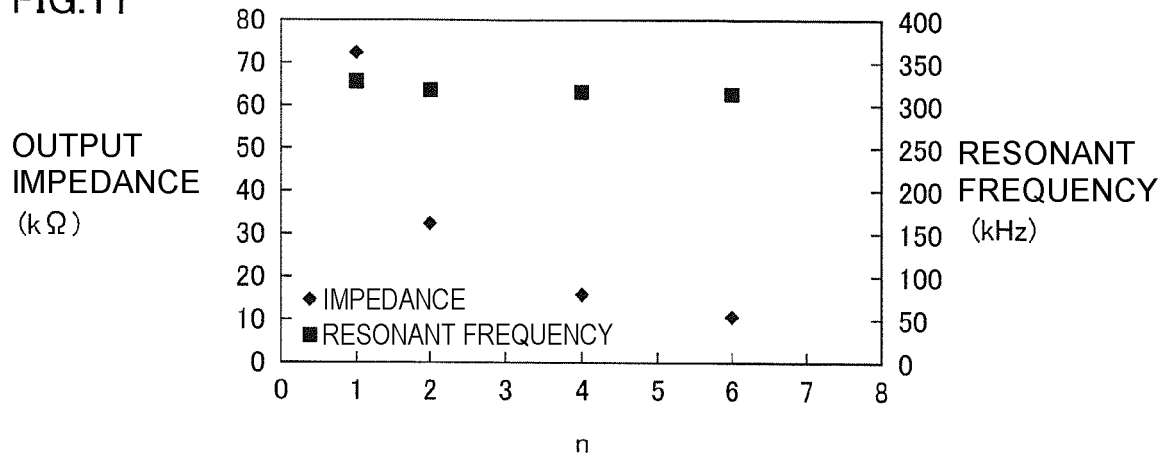
FIG. 11 is a graph relating to an output impedance obtained in the experiment performed in relation to the first exemplary embodiment.

For the devices obtained as described above, for example, an alternating-current power supply of 10 mV was connected to the input terminal as described above, a load was connected to the output terminal so as to be impedance matched, and a voltage output to the load was read out. A boosting ratio was calculated as a value obtained by dividing the amplitude of the obtained output voltage by the amplitude of the input voltage. In addition, the power at the input terminal and the power at the output terminal were simultaneously measured, and the efficiency (output power/input power) was obtained from this ratio. The results are illustrated in FIG. 10. Furthermore, the relationship between the output impedance, the resonant frequency, and n is illustrated in FIG. 11.

As illustrated in FIG. 10, it was confirmed that piezoelectric transformers can be realized that have a boosting ratio of several tenfold and an efficiency of several tens of % for each value of n. In addition, from FIG. 11, it can be confirmed that the output impedance can be lowered without greatly changing the resonant frequency while realizing the above-described performance.

In this embodiment, as illustrated in FIG. 2, a structure is employed in which a plurality of electrode pieces are arrayed in one row when seen in plan view. In the case where a structure is employed in which a plurality of electrode pieces are arrayed in just one direction in the same layer in this way, the vibration mode has a plurality of anti-nodes arrayed in that direction, but has only one anti-node in a direction perpendicular to that direction. Therefore, even if the sizes of the vibration film and the electrode pieces are increased or decreased in the perpendicular direction, the resonant frequency substantially does not change. In other words, when a vibration mode obtained using this kind of structure is used, it is possible to more easily adjust the impedance.

Embodiment 2

Figure 12:
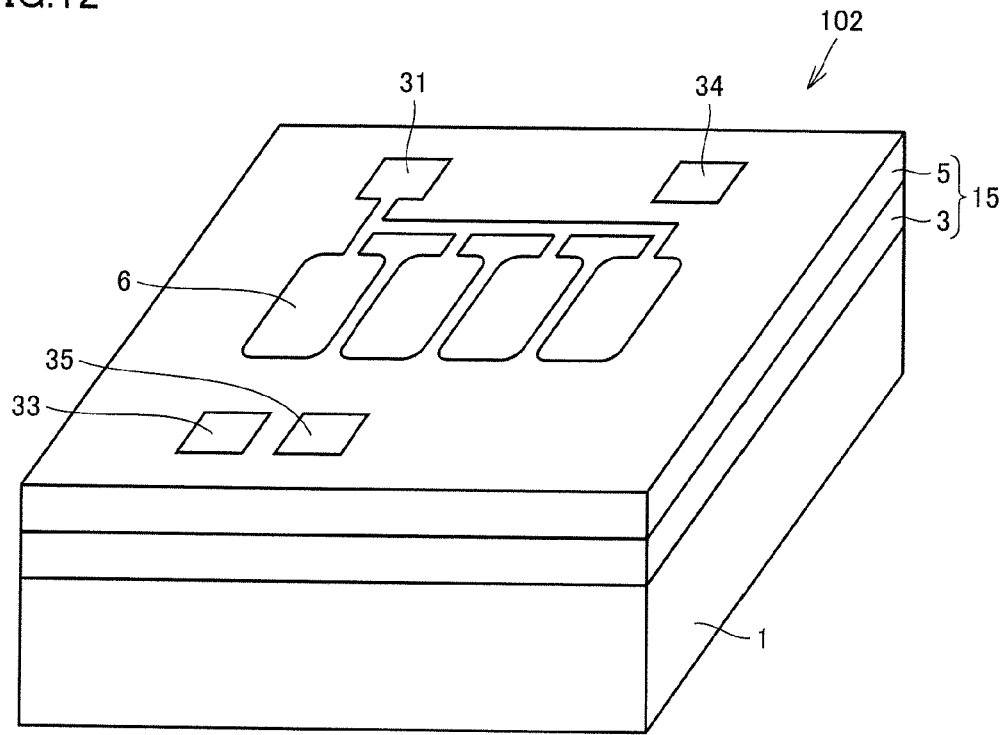
FIG. 12 is a perspective view of a piezoelectric transformer of a second exemplary embodiment.
Figure 13:
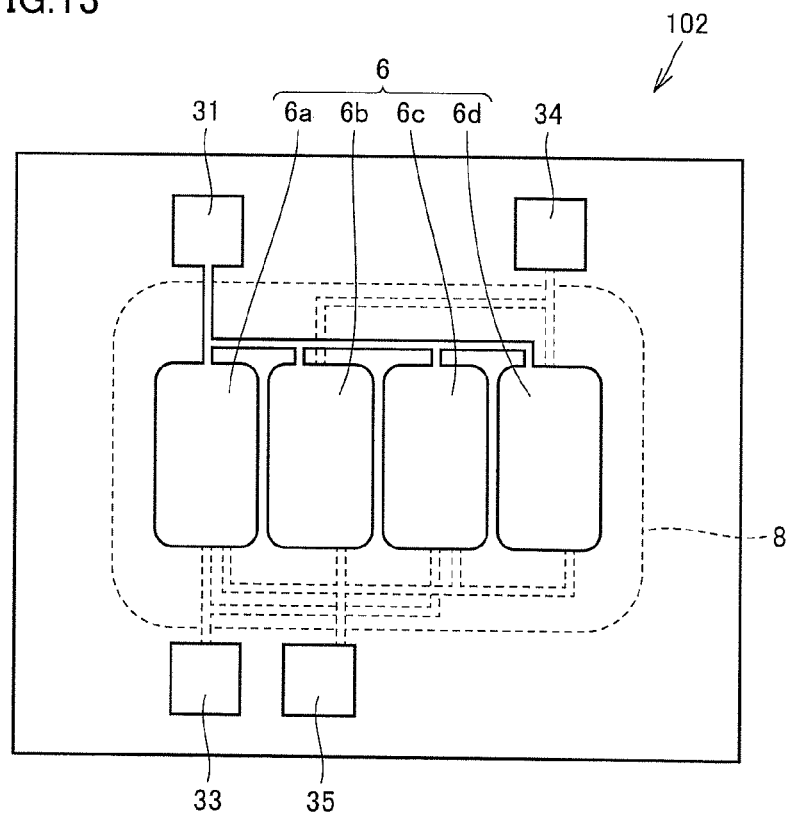
FIG. 13 is a plan view of the piezoelectric transformer of the second exemplary embodiment.
Figure 14:
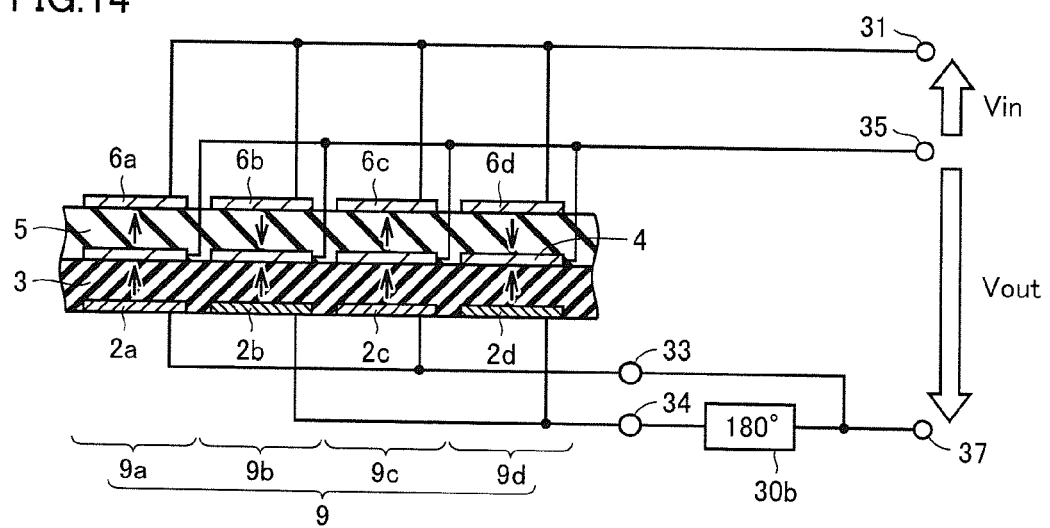
FIG. 14 is a conceptual diagram of the piezoelectric transformer of the second exemplary embodiment.

A piezoelectric transformer according to a second embodiment will be described while referring to FIGS. 12 to 14. FIG. 12 illustrates the exterior of a piezoelectric transformer 102 of this embodiment. FIG. 13 illustrates a plan view of the piezoelectric transformer 102. FIG. 14 illustrates a conceptual diagram in which a vibration film of the piezoelectric transformer 102 is illustrated together with related wiring lines.

The piezoelectric transformer 102 includes a base 1 and an upper layer 15 that is supported by the base 1. The upper layer 15 includes a vibration portion assembly portion 9, which is constituted by the part of the upper layer 15 that is not superposed with the base 1. The vibration portion assembly portion 9 includes an output electrode 2, an intermediate electrode 4, and an input electrode 6, which are arranged so as to be separated from each other in a thickness direction and so as to be sequentially arrayed in the thickness direction. The vibration portion assembly portion 9 includes n vibration portions 9a to 9d arrayed in one direction, where n is an integer greater than or equal to 2. Here, for convenience of explanation, it will be assumed that n=4 in the following description, but this is merely an example and n may be an integer other than 4. The upper layer 15 includes a first piezoelectric layer 3 that is arranged so as to include the part of the upper layer 15 that is interposed between the output electrode 2 and the intermediate electrode 4 in at least the n vibration portions 9a to 9d; and a second piezoelectric layer 5 that is arranged so as to be superposed with the first piezoelectric layer 3 and is arranged so as to include the part of the upper layer 15 that is interposed between the intermediate electrode 4 and the input electrode 6 in at least the n vibration portions 9a to 9d. The input electrode 6 includes one or more and n or less input electrode pieces 6a to 6d that are arrayed in a divided manner so as to respectively correspond to at least some of the n vibration portions 9a to 9d. The output electrode 2 includes one or more and n or less output electrode pieces 2a to 2d that are arrayed in a divided manner so as to respectively correspond to at least some of the n vibration portions 9a to 9d. The first piezoelectric layer 3 is polarized in a fixed direction throughout the n vibration portions 9a to 9d. Hereafter, for purposes of explanation, the n vibration portions will be referred to as first to nth vibration portions from one side to the other side in the one direction. As illustrated in FIG. 14, the second piezoelectric layer 5 has one or more and n or less polarization regions that correspond to at least some of the n vibration portions 9a to 9d. The one or more and n or less polarization regions are polarized so as to have opposite polarization directions in a first polarization region group, which is a group to which one or more of the polarization regions corresponding to the odd-numbered vibration portions belong, and a second polarization region group, which is a group to which one or more of the polarization regions corresponding to the even-numbered vibration portions belong.

Wiring lines are arranged such that voltages of the same phase can be applied to the one or more and n or less input electrode pieces 6a to 6d with the potential of the intermediate electrode 4 serving as a reference potential.

In this embodiment, as illustrated in FIG. 14, all of the one or more and n or less input electrode pieces 6a to 6d are connected to a pad electrode 31, which is an input terminal for an alternating-current power supply, and the potential of the intermediate electrode 4 serves as a reference potential. The pad electrode 35 is connected to the intermediate electrode 4 by wiring lines.

Wiring lines are routed such that, among the one or more and n or less output electrode pieces 2a to 2d, the phase of the voltage of a first output electrode piece group, which is a group to which one or more out of the output electrode pieces 2a and 2c corresponding to the odd-numbered vibration portions 9a and 9c belong, or the phase of the voltage of a second output electrode piece group, which is a group to which one or more out of the output electrode pieces 2b and 2d corresponding to the even-numbered vibration portions 9b and 9d belong, is inverted, the two voltages are then combined, and a voltage can be extracting using the potential of the intermediate electrode as a reference. In this embodiment, as illustrated in FIG. 14, an output voltage Vout is extracted at an output terminal 37 while using the electrical potential of the intermediate electrode 4 as a reference potential. The wiring lines that extend from the first output electrode piece group and the second output electrode piece group to the output terminal 37 are the same as those described in the first embodiment.

Figure 15:
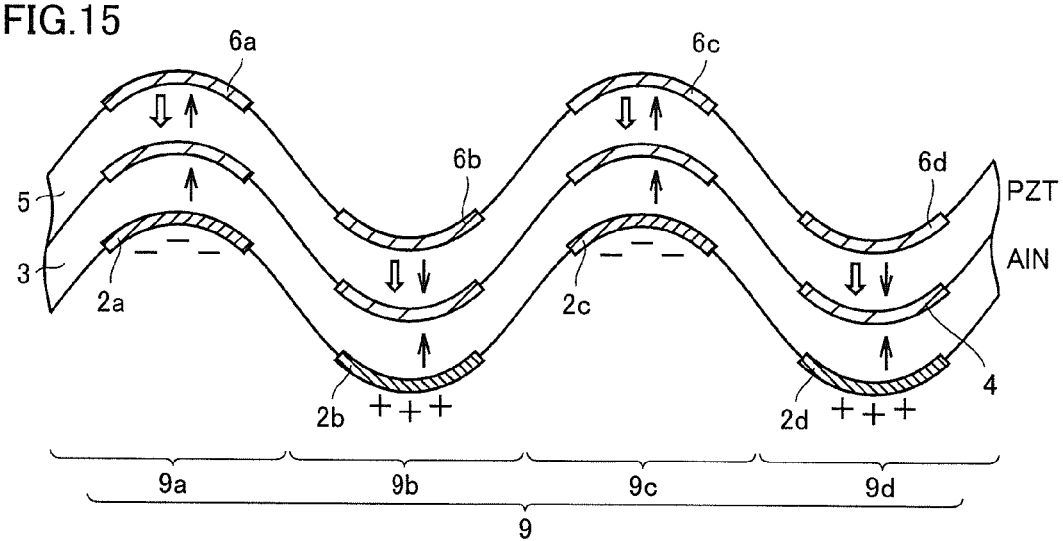
FIG. 15 is an explanatory diagram for the behavior of a vibration portion assembly portion of the piezoelectric transformer of the second exemplary embodiment.

The behavior in this embodiment when an input voltage Vin is applied is illustrated in FIG. 15. The meanings of the arrows are the same as those described with respect to FIG. 5. In FIG. 15, the voltages applied to the one or more and n or less polarization regions of the second piezoelectric layer 5 all have the same phase, and therefore the outline arrows indicating the electric field all point in the same direction. In this embodiment, the one or more and n or less polarization regions of the second piezoelectric layer 5 are polarized such that adjacent polarization regions have opposite polarization directions from each other as indicated by the simple arrows in FIG. 15, and therefore, deformation is induced in opposite directions even though the directions of the electric field in these regions are the same. Thus, the vibration portions 9a to 9d undergo resonant vibration.

Charge is generated in the first piezoelectric layer 3 on the output side by this resonant vibration. The way in which this charge is extracted as an output voltage is the same as described in the first embodiment.

The same effects as in the first embodiment can be obtained in this embodiment as well. In this embodiment, the second piezoelectric layer 5, which is on the input side, can be driven using a voltage of a single phase, and therefore the input-side wiring and circuit can be simplified.

Embodiment 3

Figure 16:
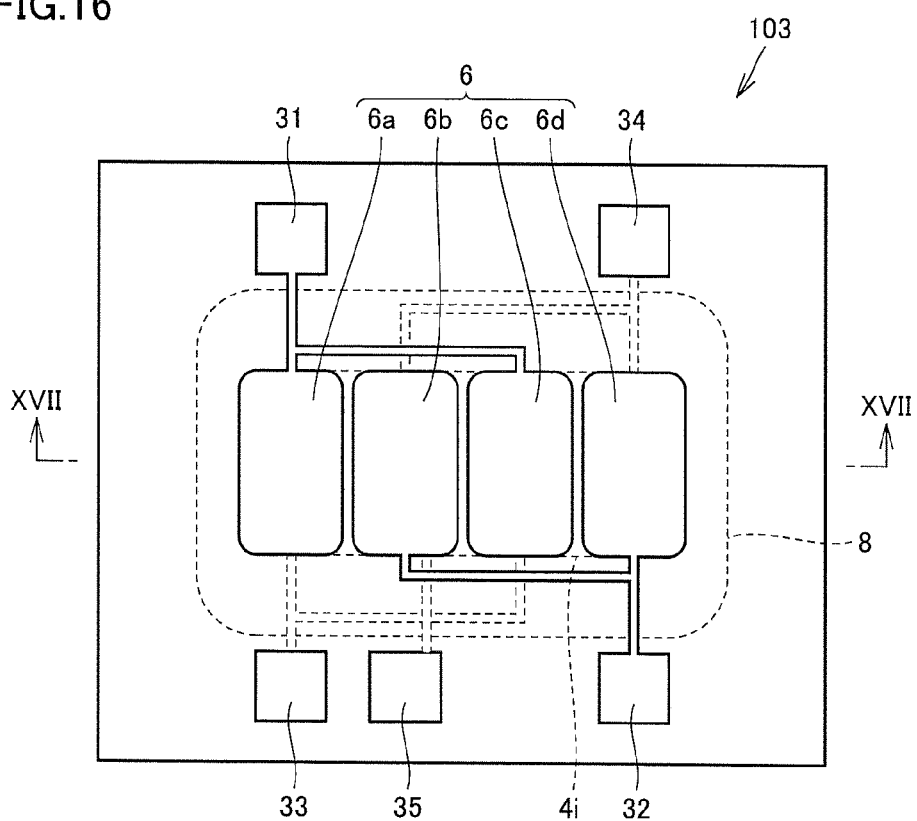
FIG. 16 is a plan view of a piezoelectric transformer of a third exemplary embodiment.
Figure 17:
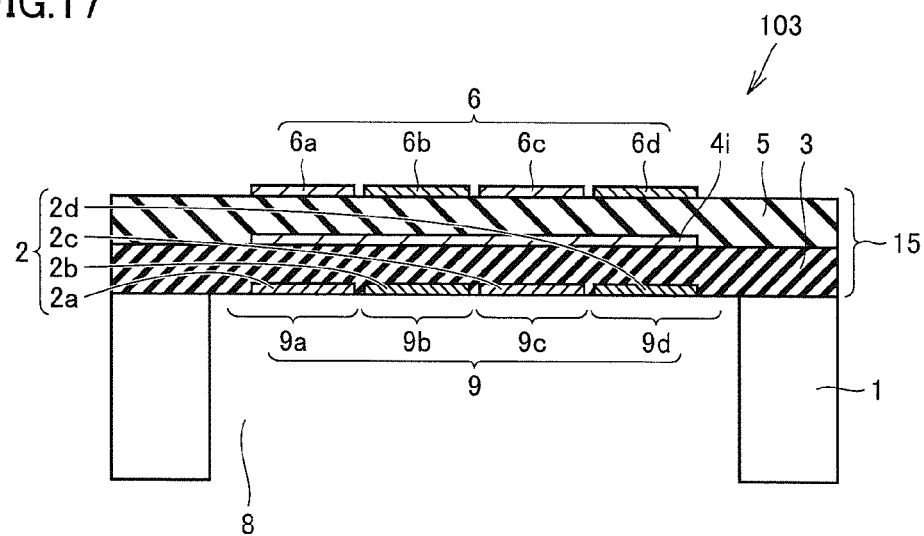
FIG. 17 is a sectional view looking in the direction of arrows and taken along line XVII-XVII in FIG. 16.

A piezoelectric transformer according to a third embodiment will be described while referring to FIGS. 16 to 17. FIG. 16 illustrates a plan view of a piezoelectric transformer 103 according to this embodiment. FIG. 17 illustrates a sectional view looking in the direction of the arrows and taken along line XVII-XVII in FIG. 16.

The basic configuration of the piezoelectric transformer 103 of this embodiment is the same as that of the piezoelectric transformer 101 described in the first embodiment, but the piezoelectric transformer 103 differs in the following ways. In this embodiment, an intermediate electrode 4i is provided. The intermediate electrode 4i includes an electrode that integrally formed so as to extend across n vibration portions. The intermediate electrode 4 of the first embodiment is divided into n island-shaped parts, whereas the intermediate electrode 4i of this embodiment is a single large electrode. In the example illustrated here, the intermediate electrode 4i extends in one piece across all of the vibration portions 9a to 9d. In FIG. 16, the outline of the intermediate electrode 4i is represented by a broken line. In FIG. 16, parts of the outline of the intermediate electrode 4i, which is at the back, are visible through the gaps between the input electrode pieces 6a to 6d. In the example illustrated here, the intermediate electrode 4i is illustrated as extending inside a region that substantially matches the external outlines of the input electrode 6 and the output electrode 2, but the region in which the intermediate electrode 4i extends is not limited to this example. For example, the intermediate electrode 4i may extend so as to protrude beyond the external outline of the input electrode 6 or the output electrode 2. The intermediate electrode 4i may extend not only inside the region occupied by the vibration film but also across a region including parts outside the vibration film.

The same effects as in the first embodiment can be obtained in this embodiment as well. In this embodiment, the intermediate electrode is not divided into island-shaped parts, and therefore the internal structure of the vibration film can be simplified. In this embodiment, a structure can be adopted in which the intermediate electrode extends in one piece over a wide region across the n vibration portions, and therefore the degree to which level differences are generated on the outermost surface of the vibration film can be reduced. In this embodiment, in this way, the vibration film can be made flatter, and the reliability of the piezoelectric transformer can be improved.

An example has been described here in which a single intermediate electrode 4i is provided so as cover all of the n vibration portions, but the exemplary embodiment of the present disclosure is not limited to this example. For example, a configuration may be adopted in which there are a plurality of intermediate electrode pieces serving as an intermediate electrode and in which at least one of the intermediate electrode pieces extends across two or more of the vibration portions.

Embodiment 4

Figure 18:
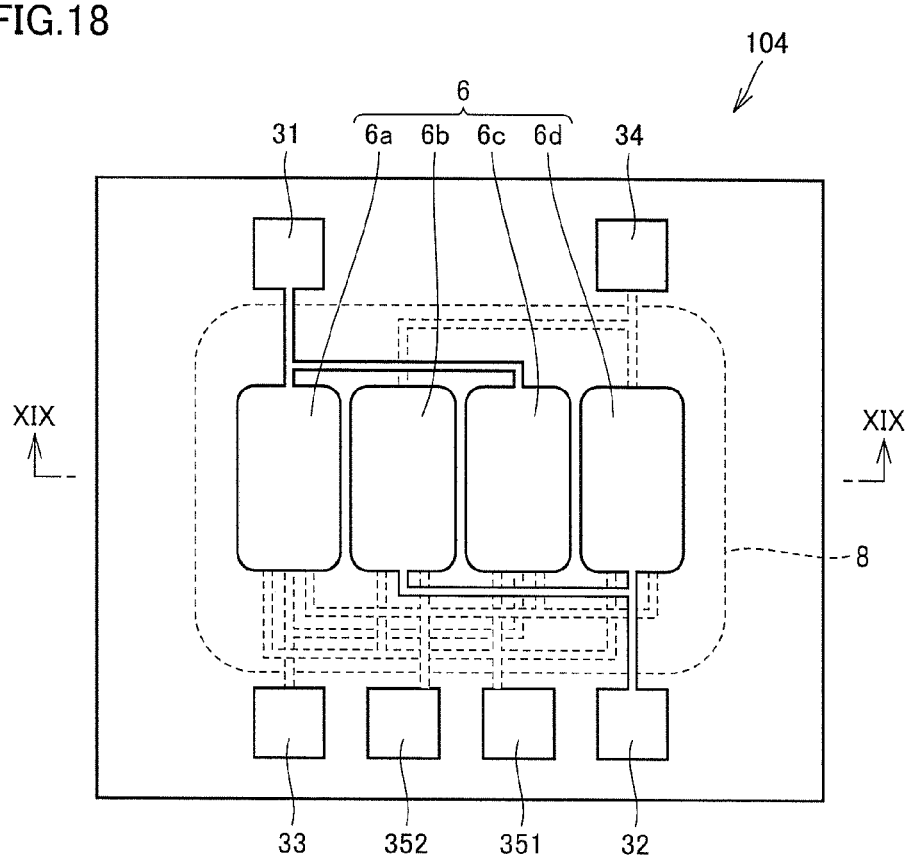
FIG. 18 is a plan view of a piezoelectric transformer of a fourth exemplary embodiment.
Figure 19:
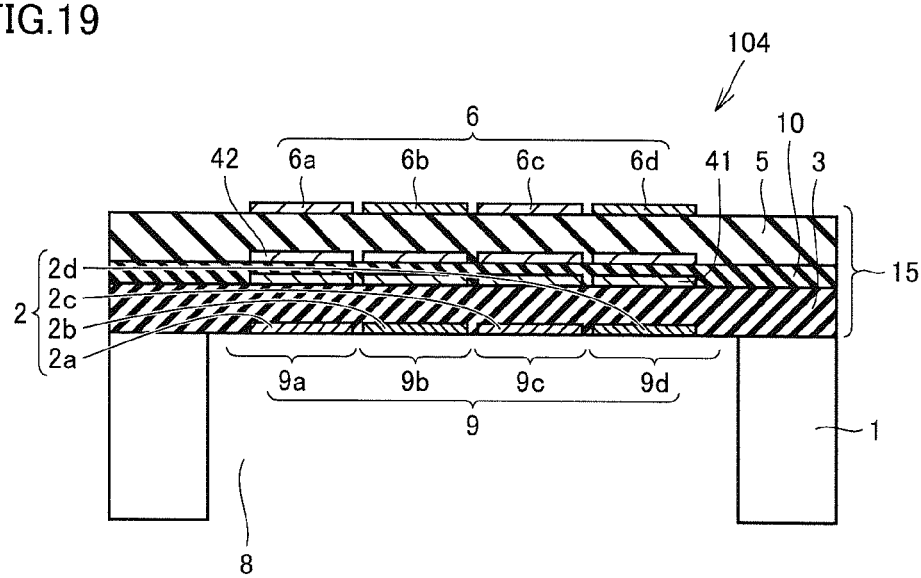
FIG. 19 is a sectional view looking in the direction of arrows and taken along line XIX-XIX in FIG. 18.
Figure 20:
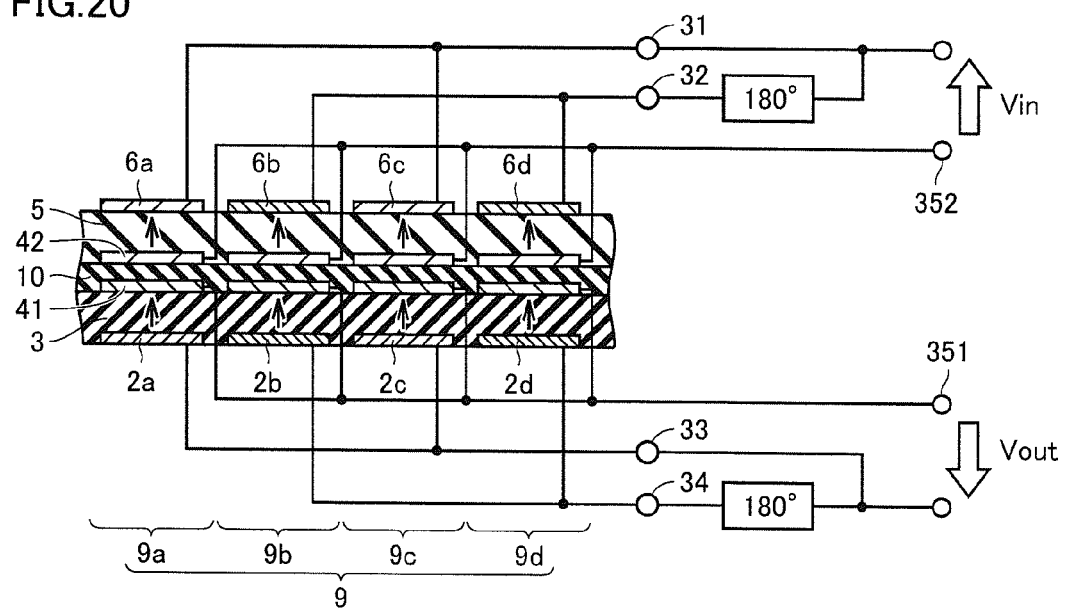
FIG. 20 is a conceptual diagram of the piezoelectric transformer of the fourth exemplary embodiment.

A piezoelectric transformer according to a fourth embodiment will be described while referring to FIGS. 18 to 20. FIG. 18 illustrates a plan view of a piezoelectric transformer 104 according to this embodiment. FIG. 19 illustrates a sectional view looking in the direction of the arrows and taken along line XIX-XIX in FIG. 18. FIG. 20 illustrates a conceptual diagram in which a vibration film of the piezoelectric transformer 104 is illustrated together with related wiring lines.

The basic configuration of the piezoelectric transformer 104 of this embodiment is the same as that of the piezoelectric transformer 101 described in the first embodiment, but the piezoelectric transformer 104 differs in the following ways. In this embodiment, the intermediate electrode includes an output-side intermediate electrode 41 and an input-side intermediate electrode 42, which are arranged so as to be separated from each other. Wiring lines are arranged such that a voltage generated between the output-side intermediate electrode 41 and the output electrode 2 can be extracted. In the example illustrated here, an intermediate insulating layer 10 is interposed between the output-side intermediate electrode 41 and the input-side intermediate electrode 42. The intermediate insulating layer 10 may be formed of the same material as the first piezoelectric layer 3 or the second piezoelectric layer 5. The intermediate insulating layer 10 may be formed of a different material from the first piezoelectric layer 3 and the second piezoelectric layer 5. In this embodiment, the output-side intermediate electrode 41 is divided into one or more and n or less island-shaped parts, that is, output-side intermediate electrode pieces. The input-side intermediate electrode 42 is divided into one or more and n or less island-shaped parts, that is, input-side intermediate electrode pieces. In the example illustrated here, the input side is disposed on the upper side and the output side is disposed on the lower side, but this is merely an example and the arrangement may be vertically reversed. The output-side intermediate electrode pieces and the output electrode pieces are arranged so as to have a substantially one-to-one correspondence. The input-side intermediate electrode pieces and the input electrode pieces are arranged so as to have a substantially one-to-one correspondence. The output electrode pieces, the output-side intermediate electrode pieces, the input-side intermediate electrode pieces, and the input electrode pieces are arranged so as to be separated from each other in the vertical direction and so as to be superposed with each other in the vertical direction inside the vibration portions of the vibration portion assembly portion 9.

The method of manufacturing the piezoelectric transformer 104 of this embodiment is basically the same as the manufacturing method for obtaining the piezoelectric transformer 101 described in the first embodiment, but differs in the following ways.

The manufacturing method of this embodiment is the same as the manufacturing method described in the first embodiment up until the output electrode 2 is formed on the surface of the base 1. In this embodiment, an AlN film is deposited as the first piezoelectric layer 3 so as to cover the output electrode 2 from above using a sputtering method such that the AlN film has a thickness of 1000 nm. Next, a Mo film is deposited with a thickness of around 100 nm so as to cover the first piezoelectric layer 3, and the Mo film is then subjecting to patterning. The output-side intermediate electrode 41 is thus obtained. An AlN film is deposited so as to have a thickness of around 100 nm as the intermediate insulating layer 10 using a sputtering method so as to cover the output-side intermediate electrode 41.

A Pt film is deposited so as to have a thickness of around 100 nm, and the Pt film is then subjected to patterning. An adhesive layer may be formed between the Pt film and the AlN film in order to form the intermediate insulating layer 10. The input-side intermediate electrode 42 is formed of the patterned Pt film.

Next, a PZT film is deposited as the second piezoelectric layer 5 using a sputtering method or a sol gel method so as to have a thickness of 1200 nm. After that, a Au film with a thickness of around 100 nm is deposited so as to cover the second piezoelectric layer 5 and the Au film is then subjected to patterning. An adhesive layer may be formed in advance between the Au film and the PZT film serving as the second piezoelectric layer 5. The input electrode 6 is formed of the patterned Au film.

Next, the first piezoelectric layer 3, the intermediate insulating layer 10, and the second piezoelectric layer 5 are subjected to etching in order to expose parts where pad electrodes will be formed that are to be respectively connected to the output electrode 2, the output-side intermediate electrode 41, and the input-side intermediate electrode 42. A pad electrode 351 is connected to the output-side intermediate electrode 41 by wiring lines. In this embodiment, the output-side intermediate electrode 41 is divided into one or more and n or less output-side intermediate electrode pieces, and therefore wiring lines are individually connected from the pad electrode 351 to the one or more and n or less output-side intermediate electrode pieces. A pad electrode 352 is connected to the input-side intermediate electrode 42 by wiring lines. In this embodiment, the input-side intermediate electrode 42 is divided into one or more and n or less input-side intermediate electrode pieces, and therefore wiring lines are individually connected from the pad electrode 352 to the one or more and n or less input-side intermediate electrode pieces. The second piezoelectric layer 5 and the intermediate insulating layer 10 are subjected to etching in order to expose the pad electrode 351. The second piezoelectric layer 5 is subjected to etching in order to expose the pad electrode 352.

The subsequent steps are identical to those described in the first embodiment.

Figure 21:
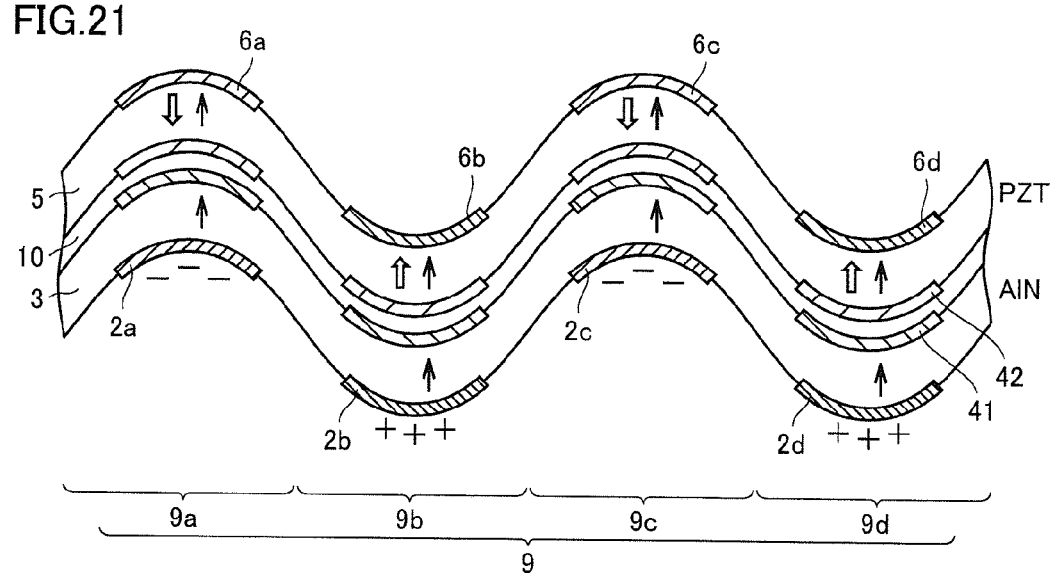
FIG. 21 is an explanatory diagram for the behavior of a vibration portion assembly portion of the piezoelectric transformer of the fourth exemplary embodiment.

The behavior in this embodiment when an input voltage Vin is applied is illustrated in FIG. 21. The meanings of the arrows are the same as those described with respect to FIG. 5. An electric field is generated as indicated by the outline arrows in each region of the second piezoelectric layer 5, and therefore deformation is induced in opposite directions in adjacent regions, and the vibration portions 9a to 9d undergo resonant vibration. Charge is generated due to the deformation induced by the resonant vibration in the first piezoelectric layer 3, which is superposed with the second piezoelectric layer 5 with the intermediate insulating layer 10 therebetween. The way in which this charge is extracted as an output voltage is the same as described in the first embodiment.

In this embodiment, the intermediate electrode has a two-layer structure formed from the output-side intermediate electrode 41 and the input-side intermediate electrode 42, and therefore the intermediate electrode involved in input and the intermediate electrode involved in output can be provided as separate electrodes. Therefore, the input-side intermediate electrode 42 and output-side intermediate electrode 41 can be insulated from each other.

In each of the above-described embodiments, an example is described in which the first piezoelectric layer 3 is formed of an AlN film and the second piezoelectric layer 5 is formed of a PZT film, but this selection and combination of materials is merely an example and different materials may be used for either or both of the first piezoelectric layer 3 and the second piezoelectric layer 5. The materials used for the first piezoelectric layer 3 and the second piezoelectric layer 5 may also be reversed.

In each of the above-described embodiments, the configuration of a piezoelectric transformer has been described while assuming that the piezoelectric transformer is mainly used for voltage boosting, but the piezoelectric transformer may be used for not only voltage boosting but also voltage lowering.

In addition, in each of the above-described embodiments, the piezoelectric layer that is on the side close to the base is used for output and the piezoelectric layer on the side far from the base is used for input, but this arrangement may be reversed.

In each of the above-described embodiments, a vibration film has been described as being a film that is arranged so as to completely close the opening 8 of the base 1. The vibration film includes the vibration portion assembly portion 9. The part of the upper layer 15 that is superposed with the base 1 will be referred to as a "base-covering upper layer" hereafter. The part of the upper layer 15 forming the vibration portion assembly portion 9 is connected to the base-covering upper layer along the entire outer periphery of the vibration portion assembly portion 9, but it should be appreciated that this is merely an example and the exemplary embodiment is not limited to this configuration. The vibration portion assembly portion 9 and the base-covering upper layer of the upper layer 15 may be connected to each other via a limited part. Part of the outer periphery of the vibration portion assembly portion 9 may be formed of a slit such that the vibration portion assembly portion 9 and the base-covering upper layer are separated from each other. The vibration portion assembly portion 9 and the base-covering upper layer may be connected to each other via a bridge-shaped part. Two or more bridge-shaped parts may be provided in order to support one vibration portion assembly portion 9.

In each of the above-described embodiments, the opening 8 is described as being a through hole, but the opening 8 is not limited to being a through hole. The base 1 surrounding the opening 8 is not limited to having a closed loop shape that is completely connected all the way around the opening 8 in a plan view, and instead a structure can be provided in which the base 1 is cut partway along its structure as in a "C" shape or a "U" shape, for example.

It is noted that for each of the above-described exemplary embodiments, an example has been described in which a voltage is applied to all of the n vibration portions that are present, but one or more vibration portions to which a voltage is not applied may be mixed in with the n vibration portions that are present, for example. An input electrode piece does not have to be formed for the vibration portion to which a voltage is not applied. The vibration portion for which corresponding input electrode piece is provided but a wiring line is not connected to the input electrode piece may also be mixed in. Thus, in the case where the vibration portion to which a voltage is not applied are mixed in, although the electrical characteristics are degraded compared with the case where such vibration portion is not mixed in, provided that the piezoelectric transformer is capable of operating as a whole, effects of a certain level can be obtained.

Furthermore, it is noted that this applies not only to the input side, but also to the output side. In each of the above-described embodiments, although a voltage is extracted from all of the vibration portions, for example, one or more vibration portions from which a voltage is not extracted may be mixed in with the n vibration portions that are present. An output electrode piece does not have to be formed for the vibration portion from which a voltage is not extracted. The vibration portion for which corresponding output electrode piece is provided but a wiring line is not connected to the output electrode piece may also be mixed in. Thus, in the case where the vibration portion from which a voltage is not extracted are mixed in, although the electrical characteristics are degraded compared with the case where such vibration portion is not mixed in, provided that the piezoelectric transformer can operate overall, effects of a certain level can be obtained.

These changes are selected as appropriate depending on the required electrical characteristics.

A configuration in which the vibration portion to which a voltage is not applied and the vibration portion from which a voltage is not extracted are not mixed in can be implemented as follows.

For example, in the piezoelectric transformer 101 according to the first exemplary embodiment (e.g., FIGS. 1 and 2), as illustrated in FIG. 4, the first input electrode piece group includes all the input electrodes 6a and 6c corresponding to the odd-numbered vibration portions 9a and 9c among the one or more and n or less input electrode pieces 6a to 6d. The second input electrode piece group includes all the input electrode pieces 6b and 6d corresponding to the even-numbered vibration portions 9b and 9d among the one or more and n or less input electrode pieces 6a to 6d. The first output electrode piece group includes all the output electrode pieces 2a and 2c corresponding to the odd-numbered vibration portions 9a and 9c among the one or more and n or less output electrode pieces 2a to 2d. The second output electrode piece group includes all the output electrode pieces 2b and 2d corresponding to the even-numbered vibration portions 9b and 9d among the one or more and n or less output electrode pieces 2a to 2d. This configuration is preferable since the vibration film can be efficiently made to vibrate and a potential difference generated by the vibration film can be efficiently extracted as an output voltage.

For example, in the piezoelectric transformer 102 according to the second embodiment (e.g., FIGS. 12 and 13), as illustrated in FIG. 14, the first output electrode piece group includes all the output electrodes 2a and 2c corresponding to the odd-numbered vibration portions 9a and 9c among the one or more and n or less output electrode pieces 2a to 2d. The second output electrode piece group includes all the output electrode pieces 2b and 2d corresponding to the even-numbered vibration portions 9b and 9d among the one or more and n or less output electrode pieces 2a to 2d. This configuration is preferable since the potential difference generated by the vibration film is efficiently extracted as an output voltage. Here, although the piezoelectric transformer 102 is referred to, the same applies to the piezoelectric transformer 103, 104.

Here, cases in which the number n of vibration portions is four have been described as an example, but cases in which n is number other than four can be considered in a similar manner.

Moreover, it is noted that a plurality of the above-described exemplary embodiments may be combined with each other as appropriate.

In addition, the presently disclosed embodiments are illustrative in all points and are not intended to be limiting. The scope of the present invention is to be defined by the scope of the claims and includes all changes within the meaning and the scope equivalent to the scope of the claims.

REFERENCE SIGNS LIST

1 base, 2 output electrode, 2a, 2b, 2c, 2d output electrode piece, 3 first piezoelectric layer, 4 intermediate electrode, 5 second piezoelectric layer, 6 input electrode, 6a, 6b, 6c, 6d input electrode piece, 8 opening, 9 vibration portion assembly portion, 9a, 9b, 9c, 9d vibration portion, 10 intermediate insulating layer, 15 upper layer, 30a, 30b phase inverter, 31, 32, 33, 34, 35, 351, 352 pad electrode, 36 input terminal, 37 output terminal, 41 output-side intermediate electrode, 42 input-side intermediate electrode, 101, 102, 103, 104 piezoelectric transformer.

The invention claimed is:

1. A piezoelectric transformer comprising:
   a base; and
   an upper layer supported by the base and that includes a vibration portion assembly formed by a portion of the upper layer that does not overlap the base in a thickness direction of the piezoelectric transformer,
   wherein the vibration portion assembly includes an output electrode, an intermediate electrode, and an input electrode, which are separated from each other in the thickness direction and are sequentially arrayed in the thickness direction,
   wherein the vibration portion assembly includes n vibration portions that are arrayed in a width direction of the piezoelectric transformer,
   wherein the upper layer includes a first piezoelectric layer that is interposed between the output electrode and the intermediate electrode in at least the n vibration portions and a second piezoelectric layer that is interposed between the intermediate electrode and the input electrode in at least the n vibration portions,
   wherein the input electrode includes between one n input electrode pieces that are arrayed in a divided manner, such that the input electrode pieces correspond to at least a portion of the n vibration portions, respectively,
   wherein the output electrode includes between one n output electrode pieces that are arrayed in a divided manner, such that the output electrode pieces correspond to at least a portion of the n vibration portions, respectively,
   wherein the first piezoelectric layer and the second piezoelectric layer are polarized in a fixed direction throughout the n vibration portions,
   wherein a first plurality of wiring lines are routed to the input electrode pieces, such that voltages of opposite phases are respectively applied to first and second groups of the input electrode pieces with a potential of the intermediate electrode serving as a reference voltage,
   wherein a second plurality of wiring lines are routed to the output electrode pieces, such that a phase of a voltage of one of first and second groups of the output electrode pieces is inverted.

2. The piezoelectric transformer according to claim 1, wherein the first plurality of wiring lines apply a first voltage to the first group of the input electrode pieces, which correspond to the odd-numbered vibration portions of the n vibration portions, and apply a second voltage to the second group of the input electrode pieces, which correspond to the even-numbered vibration portions of the n vibration portions, with the first and second voltages being in opposite phase relative to each other.

3. The piezoelectric transformer according to claim 2, wherein the first group of the output electrode pieces correspond to the odd-numbered vibration portions of the n vibration portions, and the second group of the output electrode pieces correspond to the even-numbered vibration portions of the n vibration portions.

4. The piezoelectric transformer according to claim 3, wherein the voltages of the first and second groups of the output electrode pieces are combined, and an output voltage is extracted using the potential of the intermediate electrode as the reference voltage.

5. The piezoelectric transformer according to claim 3, wherein the first group of input electrode pieces includes all of the input electrode pieces corresponding to the odd-numbered vibration portions, the second group of input electrode pieces includes all of the input electrode pieces corresponding to the even-numbered vibration portions, the first group of output electrode pieces includes all of the output electrode pieces corresponding to the odd-numbered vibration portions, and the second group of output electrode pieces includes all of the output electrode pieces corresponding to the even-numbered vibration portions.

6. The piezoelectric transformer according to claim 3, wherein the first group of output electrode pieces includes all of the output electrode pieces corresponding to the odd-numbered vibration portions and the second group of output electrode pieces includes all of the output electrode pieces corresponding to the even-numbered vibration portions.

7. The piezoelectric transformer according to claim 1, wherein the intermediate electrode includes an output-side intermediate electrode and an input-side intermediate electrode that are separated from each other.

8. The piezoelectric transformer according to claim 7, wherein at least the second plurality of wiring lines are routed such that a voltage generated between the output-side intermediate electrode and the output electrode is configured to be extracted.

9. The piezoelectric transformer according to claim 1, wherein the intermediate electrode includes an electrode that extends across the n vibration portions.

10. A piezoelectric transformer comprising:
    a base; and
    an upper layer supported by the base and that includes a vibration portion assembly formed by a portion of the upper layer,
    wherein the vibration portion assembly includes an output electrode, an intermediate electrode, and an input electrode, which are separated from each other in a thickness direction of the piezoelectric transformer,
    wherein the vibration portion assembly includes n vibration portions that are arrayed in a width direction of the piezoelectric transformer,
    wherein the upper layer includes a first piezoelectric layer between the output electrode and the intermediate and a second piezoelectric layer between the intermediate electrode and the input electrode,
    wherein the input electrode includes between one and n input electrode pieces that are arrayed in a divided manner, such that the input electrode pieces correspond to at least a portion of the n vibration portions, respectively, with n being an integer equal to or greater than 2,
    wherein the output electrode includes between one n output electrode pieces that are arrayed in a divided manner, such that the output electrode pieces correspond to at least a portion of the n vibration portions, respectively, wherein the first piezoelectric layer is polarized in a fixed direction throughout the n vibration portions, and the second piezoelectric layer includes between one and n polarization regions that correspond to at least a portion of the n vibration portions, wherein the polarization regions of the second piezoelectric layer are polarized to have opposite polarization directions, respectively, in a first polarization region group and a second polarization region group of the polarization regions, wherein a plurality of first wiring lines are routed such that voltages having a same phase are applied to the input electrode pieces with a potential of the intermediate electrode configured as a reference potential, and wherein a second plurality of wiring lines are routed to the output electrode pieces, such that a phase of a voltage of one of the first and second groups of the output electrode pieces is inverted.

11. The piezoelectric transformer according to claim 10, wherein the vibration portion assembly is formed by a portion of the upper layer that does not overlap the base in the thickness direction of the piezoelectric transformer.

12. The piezoelectric transformer according to claim 10, wherein the first polarization region group corresponds to the odd-numbered vibration portions of the n vibration portions, and the second polarization region group corresponds to the even-numbered vibration portions of the n vibration portions.

13. The piezoelectric transformer according to claim 12, wherein the first group of the output electrode pieces correspond to the odd-numbered vibration portions of the n vibration portions, and the second group of the output electrode pieces correspond to the even-numbered vibration portions of the n vibration portions.

14. The piezoelectric transformer according to claim 13, wherein the voltages of the first and second groups of the output electrode pieces are combined, and an output voltage is extracted using the potential of the intermediate electrode as the reference voltage.

15. The piezoelectric transformer according to claim 13, wherein the first group of input electrode pieces includes all of the input electrode pieces corresponding to the odd-numbered vibration portions, the second group of input electrode pieces includes all of the input electrode pieces corresponding to the even-numbered vibration portions, the first group of output electrode pieces includes all of the output electrode pieces corresponding to the odd-numbered vibration portions, and the second group of output electrode pieces includes all of the output electrode pieces corresponding to the even-numbered vibration portions.

16. The piezoelectric transformer according to claim 13, wherein the first group of output electrode pieces includes all of the output electrode pieces corresponding to the odd-numbered vibration portions and the second group of output electrode pieces includes all of the output electrode pieces corresponding to the even-numbered vibration portions.

17. The piezoelectric transformer according to claim 10, wherein the intermediate electrode includes an output-side intermediate electrode and an input-side intermediate electrode that are separated from each other.

18. The piezoelectric transformer according to claim 17, wherein at least the second plurality of wiring lines are routed such that a voltage generated between the output-side intermediate electrode and the output electrode is configured to be extracted.

19. The piezoelectric transformer according to claim 10, wherein the intermediate electrode includes an electrode that extends across the n vibration portions.

20. A piezoelectric transformer comprising:
a base; and
an upper layer coupled to the base that includes a vibration portion assembly having an output electrode, an intermediate electrode, and an input electrode, which are separated from each other in a thickness direction of the piezoelectric layer, wherein the upper layer includes a first piezoelectric layer between the output electrode and the intermediate electrode and a second piezoelectric layer between the intermediate electrode and the input electrode, wherein the input electrode includes n input electrode pieces that are arrayed in a divided manner and the output electrode includes n output electrode pieces that are arrayed in a divided manner, with n being an integer equal to or greater than 2, wherein a first plurality of wiring lines are routed to the input electrode pieces, such that voltages of opposite phases are respectively applied to first and second groups of the input electrode pieces, and wherein a second plurality of wiring lines are routed to the output electrode pieces, such that a voltage phase of one of first and second groups of the output electrode pieces is inverted.

\* \* \* \* \*